United States Patent
Wang

(10) Patent No.: US 11,245,099 B2
(45) Date of Patent: Feb. 8, 2022

(54) PACKAGING COVER PLATE, ORGANIC LIGHT-EMITTING DIODE DISPLAY AND MANUFACTURING METHOD THEREFOR

(71) Applicant: BOE Technology Group Co., Ltd., Beijing (CN)

(72) Inventor: Linlin Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 460 days.

(21) Appl. No.: 16/319,576

(22) PCT Filed: May 11, 2018

(86) PCT No.: PCT/CN2018/086604
§ 371 (c)(1),
(2) Date: Jan. 22, 2019

(87) PCT Pub. No.: WO2019/001151
PCT Pub. Date: Jan. 3, 2019

(65) Prior Publication Data
US 2021/0249632 A1     Aug. 12, 2021

(30) Foreign Application Priority Data

Jun. 26, 2017 (CN) .......................... 201710493209.X

(51) Int. Cl.
*H01L 51/52* (2006.01)
*H01L 51/56* (2006.01)
(Continued)

(52) U.S. Cl.
CPC .......... *H01L 51/5259* (2013.01); *H01L 23/20* (2013.01); *H01L 23/22* (2013.01);
(Continued)

(58) Field of Classification Search
CPC ... H01L 23/18–26; H01L 23/04; H01L 23/31; H01L 21/54; H01L 51/56; H01L 51/5259; H01L 51/5246; H01L 51/5237
See application file for complete search history.

(56) References Cited

U.S. PATENT DOCUMENTS 3,784,443 A * 1/1974 Vercasson ................ G21C 1/03
376/247
4,357,557 A * 11/1982 Inohara .................. H05B 33/04
313/232
(Continued)

FOREIGN PATENT DOCUMENTS

| CN | 1505442 A | 6/2004 |
| CN | 1507084 A | 6/2004 |

(Continued)

OTHER PUBLICATIONS

Office Action for corresponding Chinese Application 201710493209.X dated Jul. 26, 2018.
(Continued)

*Primary Examiner* — Sophia T Nguyen
(74) *Attorney, Agent, or Firm* — Arent Fox LLP; Michael Fainberg

(57) ABSTRACT

Disclosed are a packaging cover plate, an organic light-emitting diode display and a manufacturing method therefor. The packaging cover plate comprises: a cover plate body, the cover plate body being provided with open slots; cover plugs for covering openings at two ends of the open slots; and water absorption layers for at least covering mouths of the open slots. By means of the arranged open slots, the packaging cover plate can conveniently introduce a dry gas. In addition, the water absorption layers absorb water vapour, the introduced dry gas dries the water absorption layers, and the water vapour and oxygen in the water absorption layers can be taken away by means of the circular flow of the dry
(Continued)

gas, so that damage to a device by water vapour and oxygen can be reduced, and the packaging effect is better.

10 Claims, 3 Drawing Sheets

(51) Int. Cl.
*H01L 21/54* (2006.01)
*H01L 23/20* (2006.01)
*H01L 23/22* (2006.01)
*H01L 23/26* (2006.01)
*H01L 21/56* (2006.01)

(52) U.S. Cl.
CPC .......... *H01L 23/26* (2013.01); *H01L 51/5246* (2013.01); *H01L 51/56* (2013.01); *H01L 21/54* (2013.01); *H01L 21/56* (2013.01)

(56) References Cited

U.S. PATENT DOCUMENTS

| | | | | |
|---|---|---|---|---|
| 4,381,463 | A * | 4/1983 | Branover | H02K 44/085 310/11 |
| 4,441,318 | A * | 4/1984 | Theckston | F03G 7/06 60/527 |
| 4,679,317 | A * | 7/1987 | Bailleul | H01B 13/004 29/828 |
| 4,810,931 | A * | 3/1989 | McKenna | H05B 33/04 313/509 |
| 5,239,228 | A * | 8/1993 | Taniguchi | H05B 33/22 313/112 |
| 5,405,808 | A * | 4/1995 | Rostoker | H01L 23/20 156/145 |
| 5,909,057 | A * | 6/1999 | McCormick | H01L 24/28 257/704 |
| 5,962,962 | A * | 10/1999 | Fujita | H01L 51/5237 313/412 |
| 5,981,312 | A * | 11/1999 | Farquhar | H01L 21/54 257/E21.501 |
| 5,990,615 | A * | 11/1999 | Sakaguchi | H01L 51/529 313/504 |
| 6,016,006 | A * | 1/2000 | Man | H01L 21/54 257/712 |
| 6,284,342 | B1 * | 9/2001 | Ebisawa | H05B 33/04 313/512 |
| 6,737,176 | B1 * | 5/2004 | Otsuki | H05B 33/04 257/100 |
| 6,758,713 | B2 * | 7/2004 | Wei | H01L 51/524 156/379.8 |
| 6,784,612 | B2 * | 8/2004 | Park | H01L 51/5246 313/504 |
| 6,882,041 | B1 * | 4/2005 | Cheah | H01L 21/54 257/667 |
| 7,178,927 | B2 * | 2/2007 | Seo | H05B 33/14 206/204 |
| 7,482,686 | B2 * | 1/2009 | Zhao | H01L 23/24 257/687 |
| 8,202,746 | B2 * | 6/2012 | Lee | B29C 45/14655 438/28 |
| 9,345,169 | B1 * | 5/2016 | Campbell | H05K 7/20772 |
| 9,660,222 | B2 * | 5/2017 | Ikeda | H01L 51/524 |
| 10,643,924 | B1 * | 5/2020 | Shen | H01L 23/3675 |
| 2004/0075115 | A1 * | 4/2004 | Fery | H01L 51/524 257/200 |
| 2004/0082089 | A1 * | 4/2004 | Cheng | H01L 51/524 438/26 |
| 2004/0189196 | A1 * | 9/2004 | Cok | H01L 51/5259 313/512 |
| 2004/0191566 | A1 * | 9/2004 | Kikuchi | H01L 51/5246 428/690 |
| 2004/0201347 | A1 * | 10/2004 | Park | H01L 51/5237 313/512 |
| 2005/0248270 | A1 * | 11/2005 | Ghosh | H01L 51/5259 313/512 |
| 2005/0276947 | A1 * | 12/2005 | Huang | H01L 51/5259 428/76 |
| 2006/0118925 | A1 * | 6/2006 | Macris | H01L 23/433 257/667 |
| 2006/0289985 | A1 * | 12/2006 | Bettinelli | H05B 33/04 257/704 |
| 2007/0013292 | A1 * | 1/2007 | Inoue | H01L 51/5259 313/504 |
| 2007/0023873 | A1 * | 2/2007 | Park | H01L 23/24 257/666 |
| 2007/0029928 | A1 * | 2/2007 | Choi | H01L 51/5259 313/504 |
| 2007/0046198 | A1 * | 3/2007 | Kuan | H01L 51/524 313/512 |
| 2007/0152212 | A1 * | 7/2007 | Cho | H01L 51/5246 257/40 |
| 2008/0180923 | A1 * | 7/2008 | Grespan | H01L 51/5237 361/748 |
| 2009/0051724 | A1 * | 2/2009 | Katoh | B41J 2/145 347/18 |
| 2009/0066243 | A1 * | 3/2009 | Sakurai | H01L 51/5246 313/512 |
| 2009/0288695 | A1 * | 11/2009 | Jaisinghani | H02S 10/10 136/244 |
| 2010/0237453 | A1 * | 9/2010 | Bonekamp | H01L 51/525 257/432 |
| 2010/0248966 | A1 * | 9/2010 | Lynch | A01N 25/14 504/362 |
| 2010/0283384 | A1 * | 11/2010 | Lifka | H01L 51/5256 313/504 |
| 2011/0114840 | A1 * | 5/2011 | Yamazaki | G01J 5/045 250/338.1 |
| 2011/0140119 | A1 * | 6/2011 | Oh | H01L 51/5259 257/72 |
| 2011/0147916 | A1 * | 6/2011 | Su | H01L 23/42 257/692 |
| 2012/0037893 | A1 * | 2/2012 | Tanaka | H05B 33/04 257/40 |
| 2012/0098119 | A1 * | 4/2012 | Refai-Ahmed | H01L 23/22 257/714 |
| 2013/0183471 | A1 * | 7/2013 | Luhmann | G01D 7/005 428/41.1 |
| 2014/0110685 | A1 * | 4/2014 | Hong | H01L 27/32 257/40 |
| 2014/0159017 | A1 | 6/2014 | Ikeda et al. | |
| 2014/0346476 | A1 * | 11/2014 | Yao | H01L 51/5253 257/40 |
| 2015/0162568 | A1 * | 6/2015 | Bai | C09J 7/10 438/28 |
| 2015/0294919 | A1 * | 10/2015 | Notsu | H01L 23/3735 257/76 |
| 2015/0337174 | A1 * | 11/2015 | Keite-Telgenbuscher | H01L 23/26 428/138 |
| 2016/0056089 | A1 * | 2/2016 | Taniguchi | H01L 21/4882 257/714 |
| 2016/0104861 | A1 * | 4/2016 | Zeng | H01L 51/0081 257/40 |
| 2016/0118620 | A1 * | 4/2016 | Yoo | H01L 51/5259 257/40 |
| 2016/0136851 | A1 * | 5/2016 | Campbell | H05K 7/20436 264/279 |
| 2016/0240597 | A1 * | 8/2016 | Chen | H01L 27/3244 |
| 2016/0254491 | A1 * | 9/2016 | Wang | H01L 51/5246 257/40 |
| 2016/0293887 | A1 * | 10/2016 | Chen | H01L 51/5056 |
| 2016/0308161 | A1 * | 10/2016 | Qian | H01L 51/5246 |
| 2016/0315282 | A1 * | 10/2016 | Qian | H01L 51/0008 |
| 2016/0329519 | A1 * | 11/2016 | Yu | H01L 51/5259 |
| 2016/0372700 | A1 * | 12/2016 | Baisl | H01L 51/56 |
| 2017/0194597 | A1 | 6/2017 | Pang | |
| 2017/0213976 | A1 * | 7/2017 | Luo | H01L 51/56 |
| 2018/0315954 | A1 * | 11/2018 | Wu | H01L 51/56 |
| 2019/0140206 | A1 * | 5/2019 | Liu | H01L 51/102 |

(56) References Cited

U.S. PATENT DOCUMENTS

2019/0393118 A1* 12/2019 Rawlings ................ H01L 21/54
2020/0194341 A1*  6/2020 Cheng ..................... H01L 23/22
2020/0350231 A1* 11/2020 Shen ....................... H01L 23/42
2021/0102757 A1*  4/2021 Colson .................... F28D 7/106
2021/0249632 A1*  8/2021 Wang .................. H01L 51/5246

FOREIGN PATENT DOCUMENTS

| CN | 203407114 U |   | 1/2014 |
| CN | 103872260 A |   | 6/2014 |
| CN | 104979373 A |   | 10/2015 |
| CN | 106784381 A | * | 5/2017 |
| CN | 106784381 A |   | 5/2017 |
| CN | 107331787 A |   | 11/2017 |
| EP | 0776147 A   |   | 5/1997 |
| JP | 9134781 A   |   | 5/1997 |

OTHER PUBLICATIONS

Office Action for corresponding Chinese Application 201710493209.X dated Mar. 7, 2019.
International Search Report for PCT/CN2018/086604 dated Aug. 6, 2018.

* cited by examiner

PACKAGING COVER PLATE, ORGANIC LIGHT-EMITTING DIODE DISPLAY AND MANUFACTURING METHOD THEREFOR

This application is a National Stage of International Application No. PCT/CN2018/086604, filed May 11, 2018, which claims priority to Chinese Patent Application No. 201710493209.X, submitted on Jun. 26, 2017 to the Chinese Patent Office and entitled "Encapsulating Cover Plate, Organic Light-Emitting Diode Display and Fabricating Method Thereof", the entire content of which is incorporated herein by reference.

FIELD

The present disclosure relates to the technical field of displays, in particular to an encapsulating cover plate, an organic light-emitting diode display, and a fabricating method thereof.

BACKGROUND

In an OLED (Organic Light-Emitting Diode) display, most of the organic substances in a light-emitting layer are sensitive to pollutants, oxygen, and water vapor in the atmosphere. Oxygen and carbonyl compound formed by the oxidation of the light-emitting layer are an effective quencher, which may significantly reduce the light-emitting quantum efficiency of the organic light-emitting diode display; water vapor may hydrolyze the organic layer compound and affect the conductivity, resulting in great stability reduction of the organic light-emitting diode display; metal materials used to form the cathode of the organic light-emitting diode display are mostly chemically active metals, which are prone to erosion in the air or other oxygen-containing atmospheres, especially in environments containing water vapor, more prone to electrochemical corrosion. These can seriously affect the service life of devices in organic light-emitting diode displays. Therefore, the encapsulation of the OLED device ensures good internal sealing of the device, and contact with the external environment is reduced as little as possible, which is essential for stable light emitting of the OLED device.

At present, the encapsulating of the organic light-emitting diode display is mainly used to prevent the organic light-emitting diode device from being eroded by water and oxygen using film encapsulation or encapsulation resin. The water and oxygen have a certain erosion path through the edge of the encapsulation, and after a period of time of testing or placement, organic light-emitting diode devices are all subject to different degrees of erosion. Therefore, it is a very important task to improve the encapsulation effect for the organic light-emitting diode display to ensure long service life.

SUMMARY

The present disclosure provides an encapsulating cover plate, an organic light-emitting diode display, and a fabricating method thereof, to improve the encapsulating effect and prolong the service life of the organic light-emitting diode display.

In order to achieve the above objects, the present disclosure provides the following technical solutions:

The present disclosure provides an encapsulating cover plate. The encapsulating cover plate includes a cover plate body, having an open groove configured for introducing a drying gas; cap plugs, configured for covering both ends of the open groove; and a water absorption layer, configured for covering at least an open of the open groove.

The encapsulating cover plate according to the present disclosure can facilitate the introduction of the drying gas through the open groove; furthermore, the water absorption layer absorbs water vapor; the introduced drying gas dries the water absorption layer; the drying gas in circulation flow can take away the water vapor and oxygen in the water absorption layer, thus reducing the damage of water vapor and oxygen to the device, and the encapsulating effect is better. The cap plugs can seal the open groove when drying is not needed. The encapsulating cover plate according to the present disclosure can repeatedly absorb the water vapor, and can prolong the service life of the organic light-emitting diode display.

In some optional embodiments, the encapsulating cover plate further includes: a chemical drying agent doped in the water absorption layer, the chemical drying agent changes color when absorbing water. The chemical drying agent can further increase the water absorption intensity, and the change of the color can remind an operator to introduce the drying gas in time for drying.

In some optional embodiments, the chemical drying agent includes any one of copper sulfate and silica gel. The chemical drying agent can absorb water to form a substance with a new color, or can be dehydrated to regain the original color.

In some optional embodiments, the water absorption layer is a water absorption layer made of an organic material, which facilitates the bonding between film layers.

In some optional embodiments, the open groove is of a fold line shape.

In some optional embodiments, the open groove includes: a plurality of first strip-shaped grooves spaced apart along a first direction of the cover plate body, a first strip-shaped groove at a first position in an arranging direction and a first strip-shaped groove at a last position in the arranging direction having openings provided with the cap plugs, respectively; and a second strip-shaped groove for connecting two adjacent first strip-shaped grooves, the second strip-shaped groove having a length direction perpendicular to the first direction; the open groove has a large coverage area and a good water absorbing effect.

In some optional embodiments, the water absorption layer covers only the open of the open groove, and the open groove is filled with liquid metal.

In some optional embodiments, the water absorption layer covers one surface of the cover plate body, provided with the open groove.

The present disclosure also provides an organic light-emitting diode display. The organic light-emitting diode display includes: a substrate having an organic light-emitting diode device, and further includes: the encapsulating cover plate according to any one of the above embodiments. The encapsulating cover plate is configured to encapsulate the organic light-emitting diode device. Since the encapsulating cover plate has a better encapsulating effect and can prolong the service life of the organic light-emitting diode device, the organic light-emitting diode display according to the present disclosure has a long service life.

The present disclosure also provides a fabricating method of an organic light-emitting diode display. The method includes: providing a substrate on which an organic light-emitting diode device is formed; providing a cover plate body; forming an open groove for introducing a drying gas in the cover plate body; sealing both ends of the open groove by cap plugs; forming a water absorption layer for covering at least an open of the open groove; forming a sealant on the water absorption layer; and sealing and pressing the cover plate on which the sealant is formed and the substrate on which the organic light-emitting diode device is formed.

DETAILED DESCRIPTION

The technical solutions in embodiments of the present disclosure are clearly and completely described in detail below with reference to the accompanying drawings in the embodiments of the present disclosure. It is obvious that the described embodiments are only a part of the embodiments of the present disclosure, and not all of the embodiments. All other embodiments obtained by those skilled in the art based on the embodiments of the present disclosure without creative efforts shall fall into the scope of the present disclosure.

Figure 1:
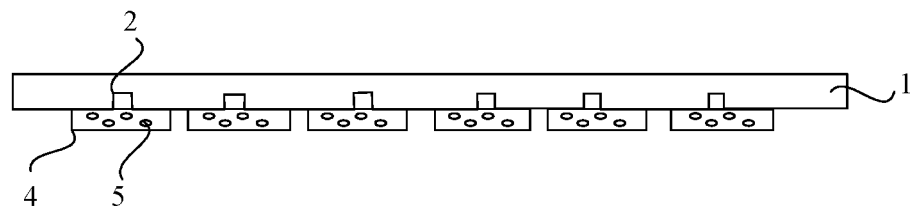
FIG. 1 is a schematic structural diagram of an encapsulating cover plate according to an embodiment of the present disclosure.
Figure 2:
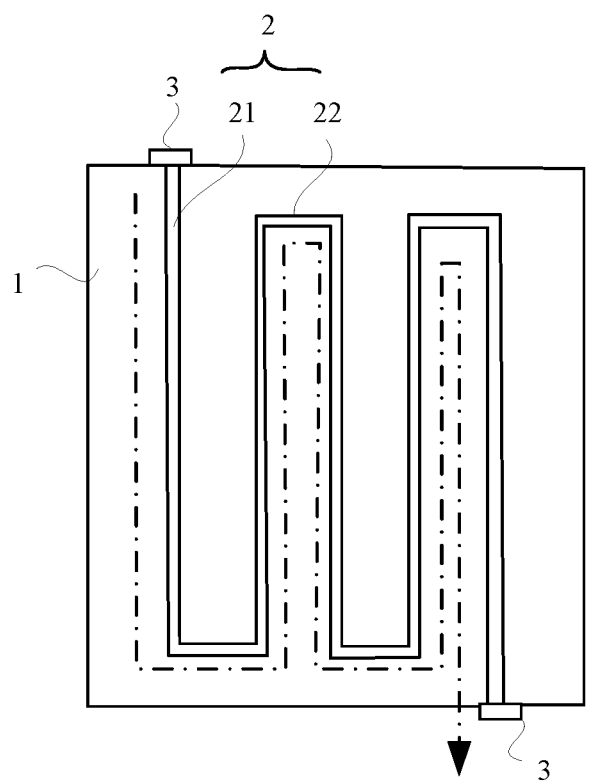
FIG. 2 is a schematic structural diagram of a cover plate body according to an embodiment of the present disclosure.
Figure 3:
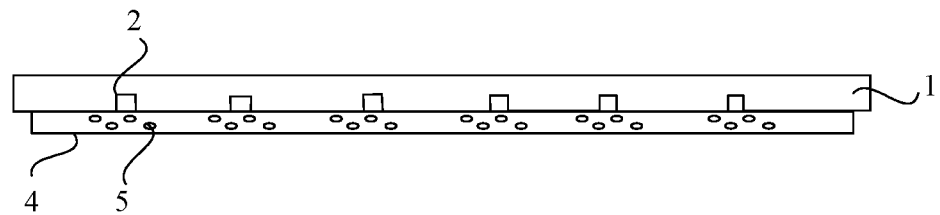
FIG. 3 is another schematic structural diagram of an encapsulating cover plate according to an embodiment of the present disclosure.

As shown in FIG. 1, FIG. 2 and FIG. 3, the present disclosure provides an encapsulating cover plate, which includes a cover plate body 1, having an open groove 2 configured for introducing a drying gas; cap plugs 3 configured for covering both ends of the groove 2; and a water absorption layer 4, configured for covering at least the open of the open groove 2.

The encapsulating cover plate according to the present disclosure is configured with the open groove 2 to facilitate the introduction of the drying gas through the open groove 2. Furthermore, the water absorption layer 4 absorbs water vapor; the introduced drying gas dries the water absorption layer 4; the drying gas in circulation flow can take away the water vapor and oxygen in the water absorption layer 4, thus reducing the damage of water vapor and oxygen to the device, and the encapsulation effect is better. The cap plugs 3 can seal the open groove 2 when there is no need to dry. The encapsulating cover plate according to the present disclosure can repeatedly absorb the water vapor, and can prolong the service life of the organic light-emitting diode display.

In order to improve the encapsulation effect of the encapsulating cover plate, the encapsulating cover plate further includes: chemical drying agent 5 doped in the water absorption layer 4, and the chemical drying agent 5 changes color when absorbing water. The chemical drying agent 5 can further increase the water absorption intensity, and the change of the color can remind an operator to introduce the drying gas in time for drying.

The water absorption layer 4 can be formed by coating or vapor deposition. The shapes of the cap plugs 3 can be set according to the shape of the openings at both ends of the open groove.

Optionally, the chemical drying agent 5 includes any one of copper sulfate and silica gel. The chemical drying agent 5 can absorb water to form a substance with a new color, or can be dehydrated to regain the original color. The copper sulfate absorbs water to become blue, and the silica gel absorbs water to become pink, and water in the chemical drying agent 5 with changed color can be taken away by the introduced drying gas to regain the chemical drying agent 5 with the original color.

The chemical drying agent 5 can be added to the water absorption layer 4 in various ways. Optionally, the chemical drying agent 5 can be added after the water absorption layer 4 is formed, specifically, by coating, printing, etc.; alternatively, the chemical drying agent 5 may be first doped into a material configured for forming the water absorption layer 4, and then the water absorption layer 4 with the chemical drying agent 5 is formed.

The drying gas may be a hot drying gas, and the drying gas may be nitrogen or argon, etc., and will not be further described herein.

Since the organic light-emitting diode display device is generally made of an organic material, the water absorption layer 4 is made of an organic material in order to improve the bonding stability between the water absorption layer 4 and the organic light-emitting diode display element. The specific materials of the water absorption layer may be various. For example, the material of the water absorption layer 4 may be resin, silica gel or the like.

The specific shapes of the open groove 2 may be various. Optionally, the shape of the open groove 2 is a fold line. Of course, the shape of the open groove 2 is not limited to a fold line. Optionally, the area of the open groove 2 covering the cover plate body 1 is as large as possible.

As shown in FIG. 2, in an embodiment according to the present disclosure, the open groove 2 includes a plurality of first strip-shaped grooves 21 spaced apart along a first direction of the cover plate body 1, a first strip-shaped groove 21 at the first position in an arranging direction and a first strip-shaped groove 21 at the last position in the arranging direction having openings provided with the cap plugs 3, respectively; and a second strip-shaped groove 22 configured for connecting two adjacent first strip-shaped grooves 21, the second strip-shaped groove 22 having a length direction perpendicular to the first direction. The open groove 2 of such a structure has a large covering area and a good water absorbing effect.

The water absorption layer 4 may be of a full layer structure or of a split structure.

In an optional embodiment, as shown in FIG. 1, the water absorption layer 4 covers only the open of the open groove 2, and the open groove 2 is filled with liquid metal. The water absorption layer 4 of such a structure has a small contact area with the cover plate body 1, and the stress is small. The water absorption layer 4 is easily bent into the open groove 2 to block the open groove 2. The liquid metal is disposed to prevent the open groove 2 from being clogged. When the drying gas is not introduced, the liquid metal can be introduced into the open groove 2, and when the drying gas needs to be introduced, the liquid metal can be sucked out first.

In another optional embodiment, as shown in FIG. 3, the water absorption layer 4 covers one surface of the encapsulating cover plate body 1 provided with the open groove 2, that is to say, the water absorption layer 4 is a full film layer, and the water absorption layer 4 of this structure is convenient to fabricate.

Figure 4:
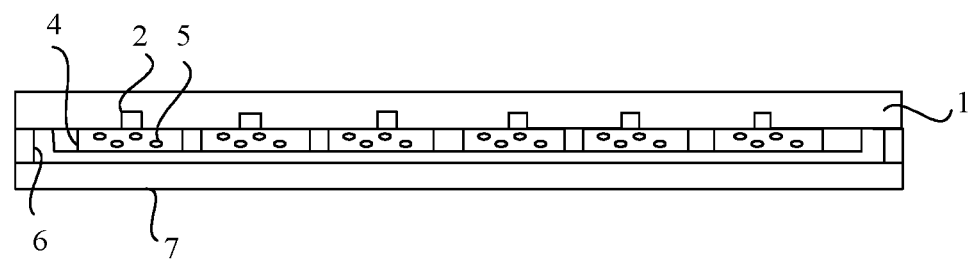
FIG. 4 is a schematic structural diagram of an organic light-emitting diode display according to an embodiment of the present disclosure.
Figure 5:
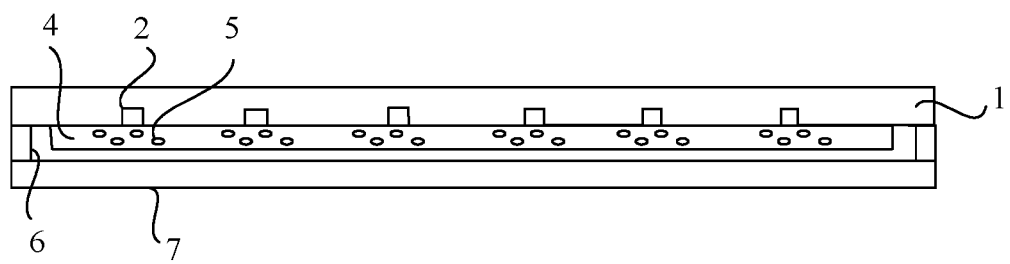
FIG. 5 is another schematic structural diagram of an organic light-emitting diode display according to an embodiment of the present disclosure.

As shown in FIG. 4 and FIG. 5, the present disclosure further provides an organic light-emitting diode display. The organic light-emitting diode display includes a substrate 7 having an organic light-emitting diode device. The organic light-emitting diode display further includes the encapsulating cover plate according to any one of the above embodiments, the encapsulating cover plate is configured for encapsulating the organic light-emitting diode device. Since the encapsulating cover plate has a better encapsulation effect and can prolong the service life of the organic light-emitting diode device, the organic light-emitting diode display according to the present disclosure has a long service life.

Usually, the encapsulating cover plate seals the organic light-emitting diode device by a sealant 6 and adheres to the substrate 7.

Figure 6:
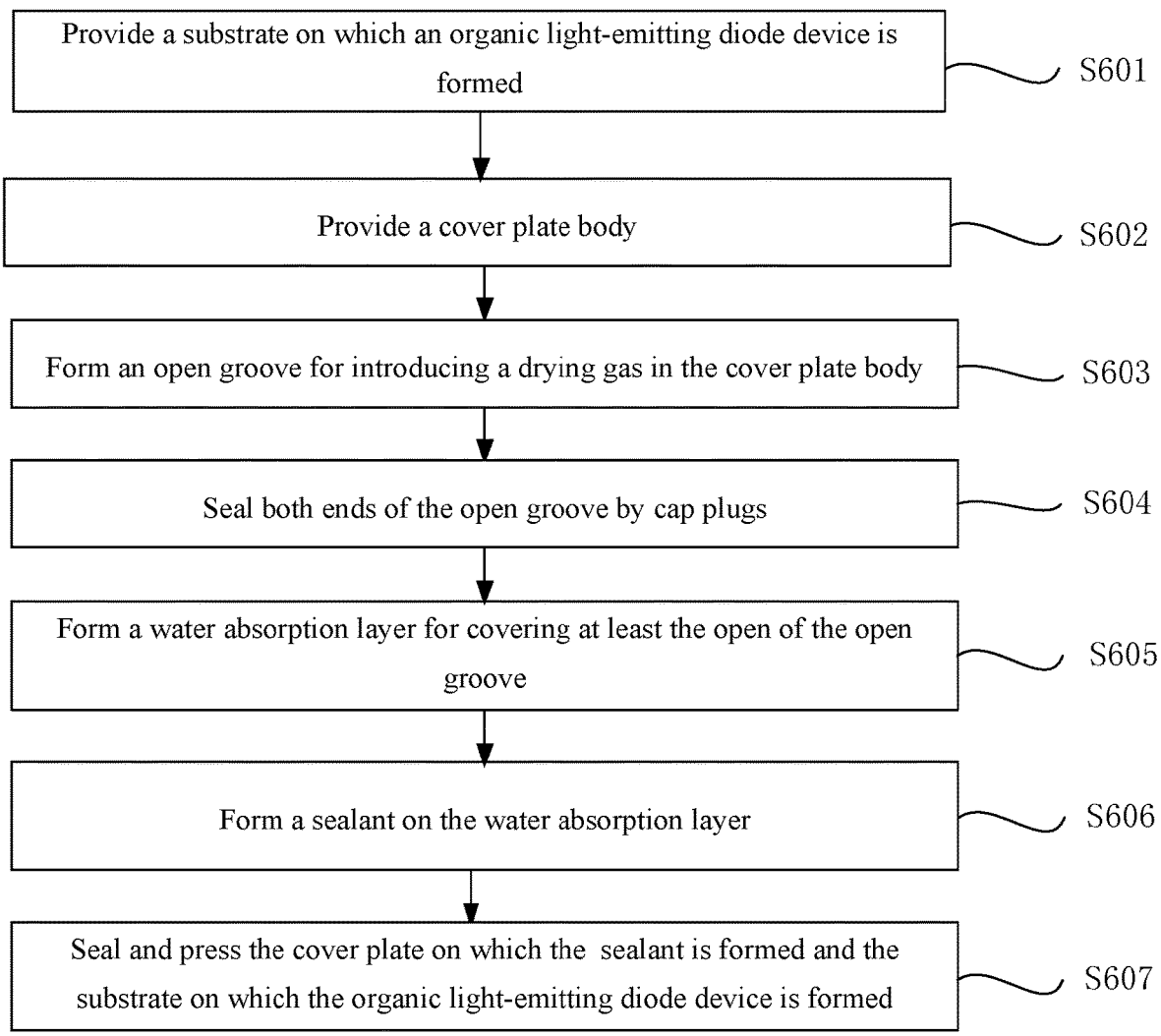
FIG. 6 is a flow chart of a fabricating method of an organic light-emitting diode display according to an embodiment of the present disclosure.

As shown in FIG. 6, the present disclosure further provides a fabricating method of an organic light-emitting diode display, including the following steps.

S601 is to provide a substrate on which an organic light-emitting diode device is formed; the organic light-emitting diode device may be formed by vapor deposition, and generally includes a functional layer, a light-emitting layer, and the like.

S602 is to provide a cover plate body.

S603 is to form an open groove configured for introducing a drying gas in the cover plate body.

S604 is to seal both ends of the open groove by cap plugs.

S605 is to form a water absorption layer configured for covering at least the open of the open groove.

S606 is to form a sealant on the water absorption layer.

S607 is to seal and press the cover plate on which the sealant is formed and the substrate on which the organic light-emitting diode device is formed.

The organic light-emitting diode display fabricated by the method can facilitate the introduction of the drying gas through the open groove formed in and the cap plugs provided on the cover plate body during use; furthermore, the water absorption layer absorbs water vapor and oxygen; the introduced drying gas dries the water absorption layer; the drying gas in circulation flow can take away the water vapor and oxygen in the water absorption layer, thus reducing the damage of the water vapor to the device, and the encapsulating effect is better, and the drying gas can be repeatedly and circularly introduced into the encapsulating cover plate provided by the present disclosure to absorb the water vapor, when there is water vapor again, the encapsulating cover plate can be dried by introducing the drying gas again. Such a structural arrangement can prolong the service life of the organic light-emitting diode display.

It will be apparent to those skilled in the art that various modifications and changes can be made in the present disclosure without departing from the spirit and scope of the present disclosure. Thus, if such modifications and changes of the present disclosure are within the scope of the appended claims and their equivalent technology, it is intended that the present invention cover the modifications and the changes.

The invention claimed is:

1. An encapsulating cover plate, comprising:
   a cover plate body, having an open groove; wherein the open groove is provided with two openings at two ends of the open groove; when the two openings are in an open state, drying gas is in circulation flow in the open groove by entering in one of the two openings and flowing out of another one of the two openings;
   cap plugs, configured for covering the two openings of the open groove; wherein the two openings are in a close state after being covered by the cap plugs; when the two openings are in the close state, the open groove is filled with liquid metal, and when the two openings are in the open state, the liquid metal is sucked out of the open groove; and
   a water absorption layer, configured for covering at least an open of the open groove and for absorbing water vapor coming from outside to a device encapsulated by the encapsulating cover plate.

2. The encapsulating cover plate according to claim 1, further comprising a chemical drying agent doped in the water absorption layer, wherein the chemical drying agent changes color when absorbing water.

3. The encapsulating cover plate according to claim 2, wherein the chemical drying agent comprises any one of copper sulfate and silica gel.

4. The encapsulating cover plate according to claim 1, wherein the water absorption layer is a water absorption layer made of an organic material.

5. The encapsulating cover plate according to claim 1, wherein the open groove is of a fold line shape.

6. The encapsulating cover plate according to claim 5, wherein the open groove comprises:
   a plurality of first strip-shaped grooves spaced apart along a first direction of the cover plate body, wherein a first strip-shaped groove at a first position in an arranging direction and a first strip-shaped groove at a last position in the arranging direction having the two openings, respectively; and
   a second strip-shaped groove for connecting two adjacent first strip-shaped grooves, the second strip-shaped groove having a length direction perpendicular to the first direction.

7. The encapsulating cover plate according to claim 1, wherein the water absorption layer covers only the open of the open groove.

8. The encapsulating cover plate according to claim 1, wherein the water absorption layer covers one surface of the cover plate body, provided with the open groove.

9. An organic light-emitting diode display, comprising: a substrate having an organic light-emitting diode device, and further comprising: the encapsulating cover plate according to claim 1, the encapsulating cover plate is configured to encapsulate the organic light-emitting diode device.

10. A fabricating method of an organic light-emitting diode display, comprising:
   providing a substrate on which an organic light-emitting diode device is formed;
   providing a cover plate body;
   forming an open groove in the cover plate body;
   sealing both ends of the open groove by cap plugs;
   forming a water absorption layer for covering at least an open of the open groove and for absorbing water vapor coming from outside to the organic light-emitting diode device;
   forming a sealant on the water absorption layer; and
   sealing and pressing the cover plate on which the sealant is formed and the substrate on which the organic light-emitting diode device is formed;
   wherein the open groove is provided with two openings at the both ends of the open groove; the two openings are in a close state after being sealed by the cap plugs; and the two openings are in an open state if the cap plugs are pulled out from the openings;

when the two openings are in the open state, drying gas is in circulation flow in the open groove by entering in one of the two openings and flowing out of another one of the two openings;

when the two openings are in the close state, the open groove is filled with liquid metal, and when the two openings are in the open state, the liquid metal is sucked out of the open groove.

* * * * *